(12) United States Patent
Hirama

(10) Patent No.: US 8,264,263 B2
(45) Date of Patent: Sep. 11, 2012

(54) QUASI-RESONANT COMPOSITE RESONANCE CIRCUIT

(76) Inventor: Koichi Hirama, Hiratsuka (JP)

( * ) Notice: Subject to any disclaimer, the term of this patent is extended or adjusted under 35 U.S.C. 154(b) by 0 days.

(21) Appl. No.: 13/061,056

(22) PCT Filed: Feb. 3, 2010

(86) PCT No.: PCT/JP2010/051478
§ 371 (c)(1),
(2), (4) Date: Feb. 25, 2011

(87) PCT Pub. No.: WO2010/131497
PCT Pub. Date: Nov. 18, 2010

(65) Prior Publication Data
US 2011/0148515 A1    Jun. 23, 2011

(30) Foreign Application Priority Data

May 15, 2009    (JP) ................ 2009-118568

(51) Int. Cl.
*H03G 5/28*    (2006.01)
(52) U.S. Cl. .............. 327/231; 327/553; 333/156
(58) Field of Classification Search .......... 327/551–559, 327/306, 308, 231, 253–259; 333/81 R, 333/118, 156; 330/156
See application file for complete search history.

(56) References Cited

U.S. PATENT DOCUMENTS

| | | | | |
|---|---|---|---|---|
| 3,737,815 A * | 6/1973 | Low et al. | ...... | 333/205 |
| 5,179,362 A * | 1/1993 | Okochi et al. | ...... | 333/181 |
| 6,204,733 B1 | 3/2001 | Cai | | |
| 6,522,221 B1 * | 2/2003 | Hayashi | ...... | 333/156 |
| 2006/0244551 A1 | 11/2006 | Ozasa et al. | | |

FOREIGN PATENT DOCUMENTS

| | | | |
|---|---|---|---|
| JP | 2002-521948 A | 7/2002 | |
| JP | 2006-319115 A | 11/2006 | |

OTHER PUBLICATIONS

Japanese Office Action issued in Japanese Application No. 2011-513262 dated Aug. 24, 2011.

* cited by examiner

*Primary Examiner* — Dinh T. Le
(74) *Attorney, Agent, or Firm* — Sughrue Mion, PLLC

(57) ABSTRACT

A composite resonance circuit is provided of which the resonance frequency is variable over a wide frequency range without changing the circuit constant of a non-resonant element having no resonance frequency. The composite resonance circuit comprises an input terminal; a resonance unit having first and second ports and quasi-resonating in response to AC signals respectively supplied to these ports; and phase shift circuits that perform different phase shifts on an AC signal supplied to the input terminal and supply first and second shifted signals subjected to the phase shift respectively to the first and second ports. The resonance unit is an impedance circuit that has at least four input terminals forming the first and second ports and that generates a quasi-resonant peak current under non-zero reactance in response to the first and second shifted signals coming in via the first and second ports. The quasi-resonant peak current is variable according to the frequency and phase shift quantities of the AC signals. Namely, the resonance frequency can be made to be variable.

4 Claims, 10 Drawing Sheets m = 4

US 8,264,263 B2

QUASI-RESONANT COMPOSITE RESONANCE CIRCUIT

CROSS REFERENCE TO RELATED APPLICATION

This application is a National Stage of International Application No. PCT/JP2010/051478 filed Feb. 3, 2010, claiming priority based on Japanese Patent Application No. 2009-118568, filed May 15, 2009, the contents of all of which are incorporated herein by reference in their entirety.

TECHNICAL FIELD

The present invention relates to a composite resonance circuit and particularly to a composite resonance circuit with which a quasi-resonant peak current is generated using no resonance element having a resonance frequency and of which the resonance frequency is variable.

BACKGROUND ART

As to electronic components such as piezoelectric vibrators having a natural resonance frequency, a method where a reactance element is connected to the resonance circuit such as a serial LC resonance circuit or a parallel LC resonance circuit is known as means for changing their zero-phase frequency, that is, the resonance frequency. As such, the resonance frequency range cannot be arbitrarily changed unless the circuit constant of a resonance circuit is changed. Meanwhile, Patent Literature 1 discloses an RC polyphase filer comprising four input terminals for receiving four-phase signals having a phase difference of 90° and a circuit for outputting four-phase signals. In this filer, a quasi-resonant peak voltage is generated using a non-resonant element without a resonance element such as a serial LC circuit, but the resonant peak voltage itself cannot be varied depending on frequency. Namely, with this type of composite resonance circuit, the resonance frequency range cannot be changed unless the circuit constant of a resonance element or a non-resonant element is changed.

Patent Literature 1: Japanese Patent Kokai No. 2006-319115

DISCLOSURE OF THE INVENTION

Problem to be Solved by the Invention

An object of the present invention is to provide a composite resonance circuit of which the resonance frequency is variable with use of a non-resonant element having no resonance frequency and without changing the circuit constant of this non-resonant element.

Means for Solving the Problem

A composite resonance circuit according to the present invention comprises an input terminal; a resonance unit having first and second ports and resonating in response to alternating-current signals respectively supplied to these ports; and phase shift circuits that perform different phase shifts on an alternating-current signal supplied to the input terminal and supply first and second shifted signals subjected to the phase shift respectively to the first and second ports. The resonance unit is an impedance circuit that has at least four input terminals forming the first and second ports and that generates a quasi-resonant peak current under non-zero reactance in response to the first and second shifted signals coming in via the first and second ports.

With this composite resonance circuit, the impedance circuit generates a quasi-resonant peak current according to the phase shift quantities of the first and second shifted signals, and the resonance frequency of the quasi-resonant peak current is variable over a wide frequency range depending on the frequency of the alternating-current signal. Thus, the resonance frequency can be made to be variable without changing the circuit constant of a non-resonant element having no resonance frequency.

EXPLANATION OF REFERENCE NUMERALS

1 Composite resonance circuit
3 Input terminal
4 First phase control circuit
5 Second phase control circuit
6 Resonance circuit

DETAILED DESCRIPTION OF THE INVENTION

Embodiment 1

Figure 1:
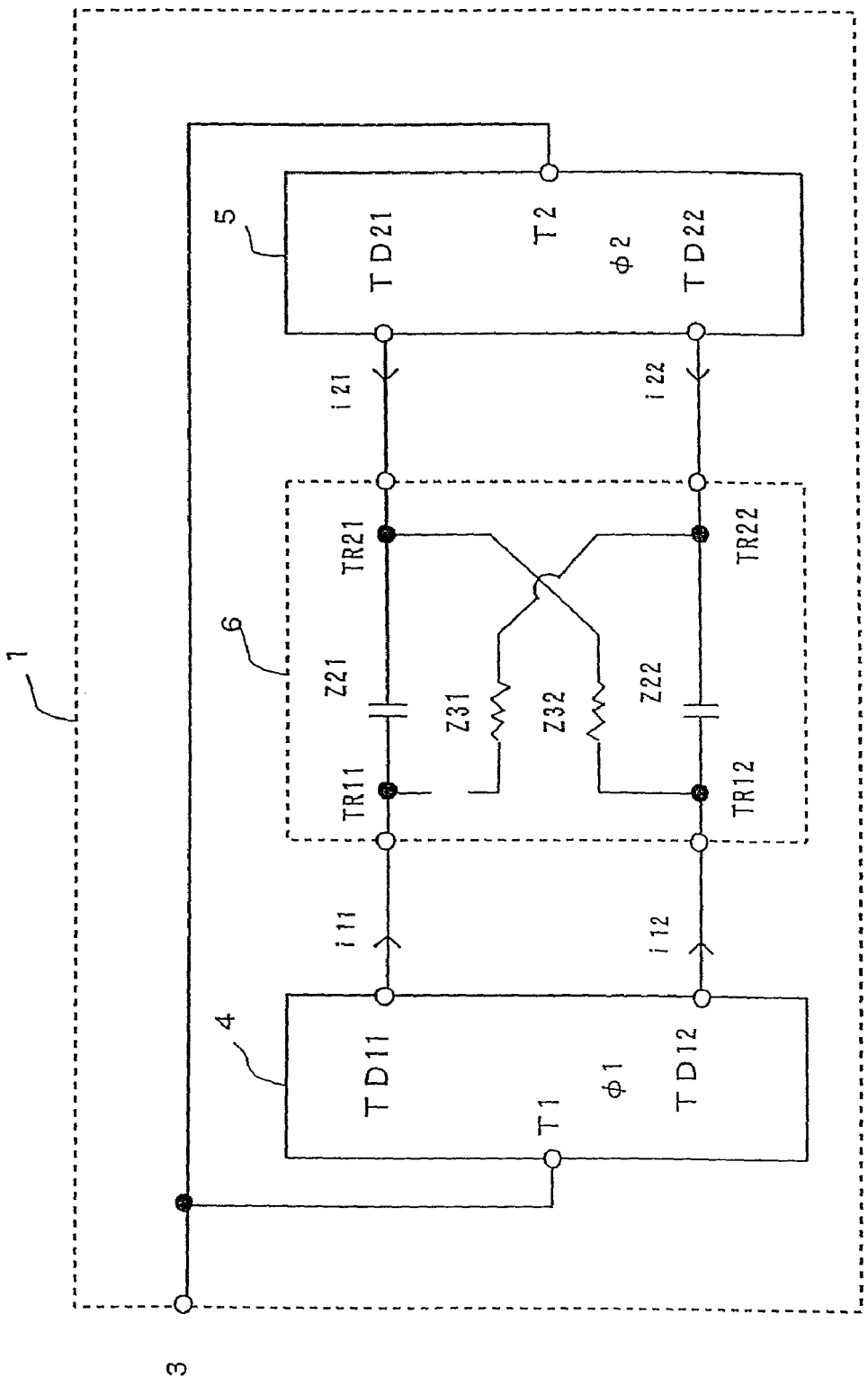
FIG. 1 is a circuit diagram of a composite resonance circuit of a first embodiment of the present invention.

FIG. 1 shows Embodiment 1 according to a composite resonance circuit of the present invention. As shown in FIG. 1, a composite resonance circuit 1 comprises an input terminal 3; a resonance circuit 6 having input terminals TR11, TR12 and input terminals TR21, TR22 of first and second ports and resonating in response to alternating-current signals respectively supplied to these ports; and first and second phase control circuits 4 and 5 performing different phase shifts on an alternating-current signal supplied to the input terminal 3 to supply first and second shifted signals subjected to the phase shift respectively to the first port terminals and the second port terminals. The resonance circuit 6 is an impedance circuit having four input terminals TR11, TR12 and TR21, TR22 forming the first and second ports and which generates a quasi-resonant peak current under non-zero reactance in response to the first and second shifted signals coming in via the first and second ports.

The components of the composite resonance circuit 1 shown in FIG. 1 will be further described in detail. The input terminal 3 of the composite resonance circuit 1 of FIG. 1 is connected to a standard signal generator SG (not shown), and an input signal having its output power maintained constant and its frequency f swept continuously is applied to the input terminal 3 of the composite resonance circuit 1. The input signal is supplied to each of an input terminal T1 of the first phase control circuit 4 and an input terminal T2 of the second phase control circuit 5.

The first phase control circuit 4 has the input terminal T1 and phase control output terminals TD11, TD12. The input terminal T1 is connected to the input terminal 3; the phase control output terminal TD11 is connected to the TR11 of the resonance circuit 6; and the phase control output terminal TD12 is connected to the TR12 of the resonance circuit 6.

The first phase control circuit 4 has the input signal inputted thereto via the input terminal T1. The first phase control circuit 4 shifts the phase of the input signal applied to the input terminal T1 by $\phi_1$ and outputs the signal having its phase shifted by $\phi_1$ via the phase control output terminal TD11 to the TR11. The first phase control circuit 4 shifts the phase of the input signal applied to the input terminal T1 by $\phi_1+180°$ and outputs the signal having its phase shifted by $\phi_1+180°$ via the phase control output terminal TD12 to the TR12.

The second phase control circuit 5 has the input terminal T2 and phase control output terminals TD21, TD22. The input terminal T2 is connected to the input terminal 3; the phase control output terminal TD21 is connected to the TR21 of the resonance circuit 6; and the phase control output terminal TD22 is connected to the TR22 of the resonance circuit 6.

The second phase control circuit 5 has the input signal inputted thereto via the input terminal T2. The second phase control circuit 5 shifts the phase of the input signal applied to the input terminal T2 by $\phi_2$ and outputs the signal having its phase shifted by $\phi_2$ via the phase control output terminal TD21 to the TR21. The second phase control circuit 5 shifts the phase of the input signal applied to the input terminal T2 by $\phi_2+180°$ and outputs the signal having its phase shifted by $\phi_2+180°$ via the phase control output terminal TD22 to the TR22.

Here, the phase shift of the first phase control circuit 4 and the second phase control circuit 5 will be described. The first phase control circuit 4 shifts the phase of the input signal of the frequency f output from the standard signal generator SG by the phase of $\phi_1$ so that phase differences at the two phase control terminals are equal. Thus, the phase of the signal output from the phase control output terminal TD11 is shifted by $\phi_1$ with respect to the input signal, and the phase of the signal output from the phase control output terminal TD12 is shifted by $\phi_1+180°$ with respect to the input signal. The second phase control circuit 5 shifts the phase of the input signal of the frequency f output from the standard signal generator SG by the phase of $\phi_2$ so that phase differences at the two phase control terminals are equal. Thus, the phase of the signal output from the phase control output terminal TD21 is shifted by $\phi_2$ with respect to the input signal, and the phase of the signal output from the phase control output terminal TD22 is shifted by $\phi_2+180°$ with respect to the input signal.

Meanwhile, the signal having its phase shifted by $\phi_1$ with respect to the input signal is applied to the first port terminal TR11 of the resonance circuit 6, and the signal having its phase shifted by $\phi_2$ with respect to the input signal is applied to the second port terminal TR21. The phase difference between the two is ($\phi_1-\phi_2$). The signal having its phase shifted by $\phi_1+180°$ with respect to the input signal is applied to the first port terminal TR12 of the resonance circuit 6, and the signal having its phase shifted by $\phi_2+180°$ with respect to the input signal is applied to the second port terminal TR22. The phase difference between the two is ($\phi_1-\phi_2$). As such, the phase difference between the signals supplied to the first port terminal TR11 and the second port terminal TR21 of the resonance circuit 6 and the phase difference between the signals supplied to the first port terminal TR12 and the second port terminal TR22 are both ($\phi_1-\phi_2$). For this phase difference ($\phi_1-\phi_2$), the phase difference ($\phi_2-\phi_1$) with respect to phase $\phi_1$ at the first port is referred to as a control phase quantity and denoted by ($\phi_2-\phi_1$) or $\phi$.

Next, the resonance circuit 6 shown in FIG. 1 will be described. The resonance circuit 6 has the first port terminals TR11 and TR12, and the second port terminals TR21 and TR22. The resonance circuit 6 comprises Z21 (a capacitor) connected between terminals TR11 and TR21, Z22 (a capacitor) connected between terminals TR12 and TR22, Z31 (a resistor) connected between terminals TR11 and TR22, and Z32 (a resistor) connected between terminals TR12 and TR21. The resonance circuit 6 has the signal having its phase shifted by $\phi_1$ with respect to the input signal inputted thereto via terminal TR11, has the signal having its phase shifted by $\phi_1+180°$ with respect to the input signal inputted thereto via terminal TR12, has the signal having its phase shifted by $\phi_2$ with respect to the input signal inputted thereto via terminal TR21, and has the signal having its phase shifted by $\phi_2+180°$ with respect to the input signal inputted thereto via terminal TR22. The resonance circuit 6 generates a quasi-resonant peak current under non-zero reactance in response to these shifted signals supplied via the first and second ports.

Next, the effect of the composite resonance circuit 1 according to Embodiment 1 will be described using simulation results shown in FIG. 2. The simulation shown in FIG. 2 was executed with the capacitance value of Z21 (a capacitor) being set at 15.91549431 (pF), the capacitance value of Z22 (a capacitor) at 15.91549431 (pF), the resistance value of Z31 (a resistor) at 1,000 ($\Omega$), and the resistance value of Z32 (a resistor) at 1,000 ($\Omega$), and also with the internal resistance R1 of the first phase control circuit 4 connected to the resonance circuit 6 on the first port side being set at 1,000 ($\Omega$) and the internal resistance R2 of the second phase control circuit 5 on the second port side at 1,000 ($\Omega$).

Figure 2:
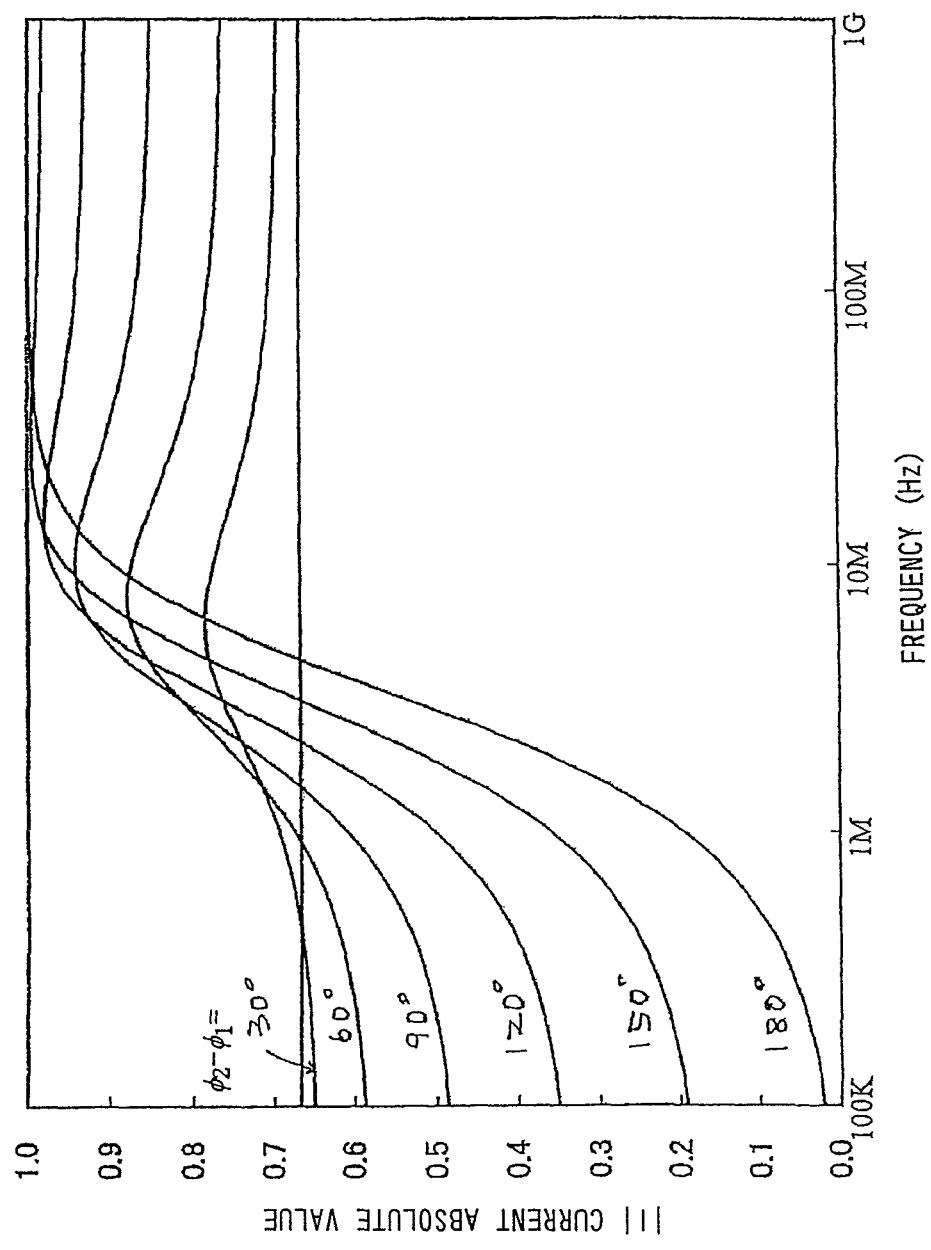
FIG. 2 is a graph of simulation results of the composite resonance circuit shown in FIG. 1.

FIG. 2 shows numerical simulation results of the composite resonance circuit shown in FIG. 1. The horizontal axis represents the frequency (Hz) of the input signal with a range of 100 KHz to 1 GHz, and its scale is a logarithmic scale. The vertical axis represents the absolute value |I| of the current flowing into the first port terminal TR11 of the resonance circuit 6. The absolute value of the current flowing into this terminal TR11 takes on a maximum value. The frequency at which this maximum value occurs is called a peak frequency (fm). The frequency at this peak frequency is called a resonance frequency, and the current which flows at this resonance frequency is called a quasi-resonant peak current.

As shown in FIG. 2, when ($\phi_2-\phi_1$) is 0', |I| is almost constant not depending on frequency, but it is seen that as ($\phi_2-\phi_1$) increases, the frequency dependence of |I| increases. It is seen that at a frequency of 100 KHz, as ($\phi_2-\phi_1$) increases, the current value |I| decreases, but that in the vicinity of a frequency of 100 MHz, as ($\phi_2-\phi_1$) increases, the current value |I| increases. That is, it is seen that as ($\phi_2-\phi_1$) increases, the symmetry of |I| against frequency is reduced, but that the peak value of |I| increases and shifts to the higher frequency side. From this, it is seen that even with the resonance circuit 6 included in the composite resonance circuit 1 having no resonance element, a quasi-resonant peak current can be generated, and that by changing $(\phi_2-\phi_1)$, the quasi-resonant peak current can be varied over a wide frequency range. That is, the resonance frequency can be varied.

Embodiment 2

Figure 3:
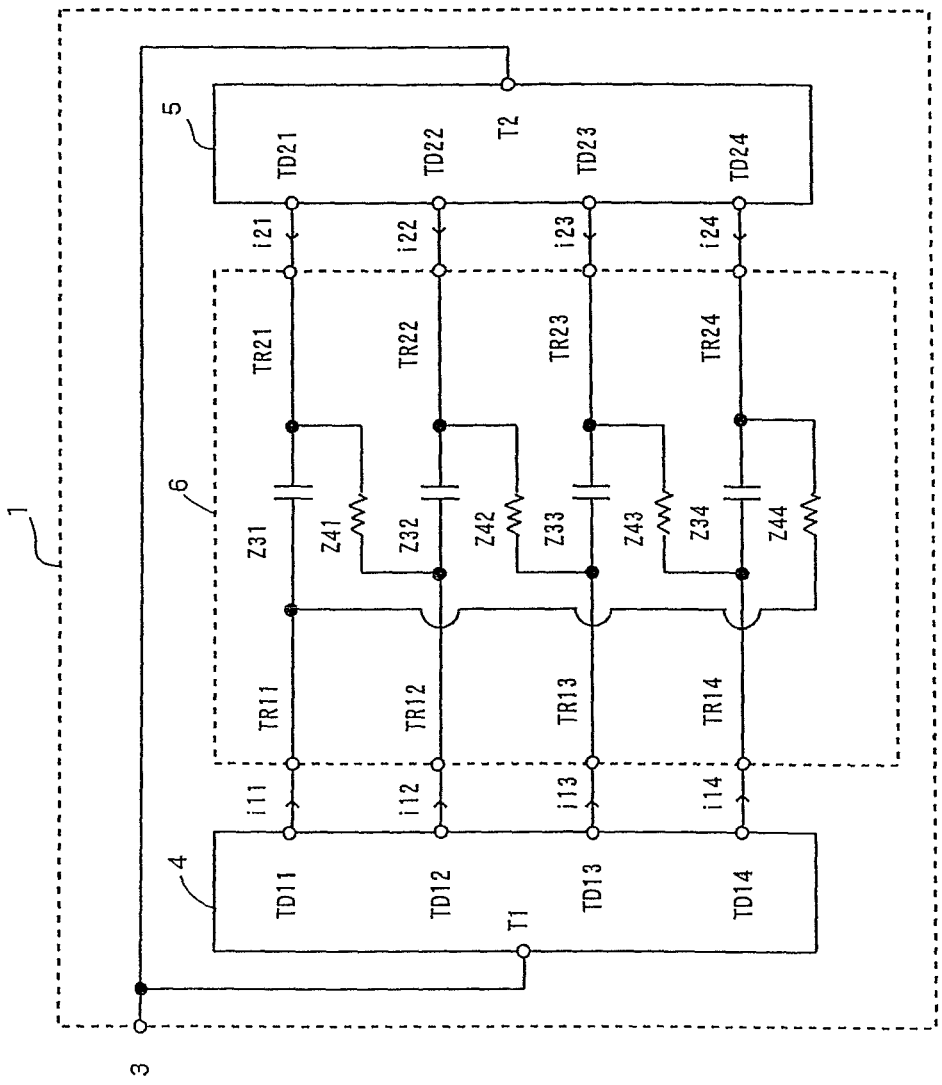
FIG. 3 is a circuit diagram of a composite resonance circuit of a second embodiment of the present invention.

Next, a composite resonance circuit according to the present invention will be described using FIGS. 3 and 4. The components of the composite resonance circuit 1 shown in FIG. 3 will be further described in detail. The input terminal 3 of the composite resonance circuit 1 of FIG. 3 is connected to a standard signal generator SG (not shown) as in FIG. 1, and an input signal having its output power maintained constant and its frequency f swept continuously is applied to the input terminal 3 of the composite resonance circuit 1. The input signal is supplied to each of an input terminal T1 of the first phase control circuit 4 and an input terminal T2 of the second phase control circuit 5.

The first phase control circuit 4 has the input terminal T1 and phase control output terminals TD11, TD12, TD13, TD14. The input terminal T1 is connected to the input terminal 3; the phase control output terminal TD11 is connected to the TR11 of the resonance circuit 6; the phase control output terminal TD12 is connected to the TR12 of the resonance circuit 6; the phase control output terminal TD13 is connected to the TR13 of the resonance circuit 6; and the phase control output terminal TD14 is connected to the TR14 of the resonance circuit 6. The first phase control circuit 4 has the input signal inputted thereto via the input terminal T1. The first phase control circuit 4 shifts the phase of the input signal applied to the input terminal T1 by $\phi_1$ and outputs the signal having its phase shifted by $\phi_1$ via the phase control output terminal TD11 to the TR11. The first phase control circuit 4 shifts the phase of the input signal applied to the input terminal T1 by $\phi_1+90°$ and outputs the signal having its phase shifted by $\phi_1+90°$ via the phase control output terminal TD12 to the TR12. The first phase control circuit 4 shifts the phase of the input signal applied to the input terminal T1 by $\phi_1+180°$ and outputs the signal having its phase shifted by $\phi_1+180°$ via the phase control output terminal TD13 to the TR13. The first phase control circuit 4 shifts the phase of the input signal applied to the input terminal T1 by $\phi_1+270°$ and outputs the signal having its phase shifted by $\phi_1+270°$ via the phase control output terminal TD14 to the TR14.

The second phase control circuit 5 has the input terminal T2 and phase control output terminals TD21, TD22, TD23, TD24. The input terminal T2 is connected to the input terminal 3; the phase control output terminal TD21 is connected to the TR21 of the resonance circuit 6; the phase control output terminal TD22 is connected to the TR22 of the resonance circuit 6; the phase control output terminal TD23 is connected to the TR23 of the resonance circuit 6; and the phase control output terminal TD24 is connected to the TR24 of the resonance circuit 6.

The second phase control circuit 5 has the input signal inputted thereto via the input terminal T2. The second phase control circuit 5 shifts the phase of the input signal applied to the input terminal T2 by $\phi_2$ and outputs the signal having its phase shifted by $\phi_2$ via the phase control output terminal TD21 to the TR21. The second phase control circuit 5 shifts the phase of the input signal applied to the input terminal T2 by $\phi_2+90°$ and outputs the signal having its phase shifted by $\phi_2+90°$ via the phase control output terminal TD22 to the TR22. The second phase control circuit 5 shifts the phase of the input signal applied to the input terminal T2 by $\phi_2+180°$ and outputs the signal having its phase shifted by $\phi_2+180°$ via the phase control output terminal TD23 to the TR23. The second phase control circuit 5 shifts the phase of the input signal applied to the input terminal T2 by $\phi_2+270°$ and outputs the signal having its phase shifted by $\phi_2+270°$ via the phase control output terminal TD24 to the TR24.

Here, the phase shift quantities of the first phase control circuit 4 and the second phase control circuit 5 will be described. The first phase control circuit 4 shifts the phase of the input signal of the frequency f output from the standard signal generator SG by the phase of $\phi_1$ so that phase differences at the four phase control terminals are equal. Thus, the phase of the signal output from the phase control output terminal TD11 is shifted by $\phi_1$ with respect to the input signal; the phase of the signal output from the phase control output terminal TD12 is shifted by $\phi_1+90°$ with respect to the input signal; the phase of the signal output from the phase control output terminal TD13 is shifted by $\phi_1+180°$ with respect to the input signal; and the phase of the signal output from the phase control output terminal TD14 is shifted by $\phi_1+270°$ with respect to the input signal. The second phase control circuit 5 shifts the phase of the input signal of the frequency f output from the standard signal generator SG by the phase of $\phi_2$ so that phase differences at the four phase control terminals are equal. Thus, the phase of the signal output from the phase control output terminal TD21 is shifted by $\phi_2$ with respect to the input signal; the phase of the signal output from the phase control output terminal TD22 is shifted by $\phi_2+90°$ with respect to the input signal; the phase of the signal output from the phase control output terminal TD23 is shifted by $\phi_2+180°$ with respect to the input signal; and the phase of the signal output from the phase control output terminal TD24 is shifted by $\phi_2+270°$ with respect to the input signal.

Meanwhile, the signal having its phase shifted by $\phi_1$ with respect to the input signal is applied to the first port terminal TR11 of the resonance circuit 6, and the signal having its phase shifted by $\phi_2$ with respect to the input signal is applied to the second port terminal TR21. The phase difference between the two is $(\phi_1-\phi_2)$. The signal having its phase shifted by $\phi_1+90°$ with respect to the input signal is applied to the first port terminal TR12 of the resonance circuit 6, and the signal having its phase shifted by $\phi_2+90°$ with respect to the input signal is applied to the second port terminal TR22. The phase difference between the two is $(\phi_1-\phi_2)$. The signal having its phase shifted by $\phi_1+180°$ with respect to the input signal is applied to the first port terminal TR13 of the resonance circuit 6, and the signal having its phase shifted by $\phi_2+180°$ with respect to the input signal is applied to the second port terminal TR23. The phase difference between the two is $(\phi_1-\phi_2)$. The signal having its phase shifted by $\phi_1+270°$ with respect to the input signal is applied to the first port terminal TR14 of the resonance circuit 6, and the signal having its phase shifted by $\phi_2+270°$ with respect to the input signal is applied to the second port terminal TR24. The phase difference between the two is $(\phi_1-\phi_2)$.

As such, the phase difference between the signals supplied to the first port terminal TR11 and the second port terminal TR21 of the resonance circuit 6, the phase difference between the signals supplied to the first port terminal TR12 and the second port terminal TR22, the phase difference between the signals supplied to the first port terminal TR13 and the second port terminal TR23, and the phase difference between the signals supplied to the first port terminal TR14 and the second port terminal TR24 are all $(\phi_1-\phi_2)$. For this phase difference $(\phi_1-\phi_2)$, the phase difference $(\phi_2-\phi_1)$ with respect to phase $\phi_1$ at the first port is referred to as a control phase quantity and denoted by $\phi$ as already mentioned.

Next, the resonance circuit 6 shown in FIG. 3 will be described. The resonance circuit 6 has the first port terminals TR11, TR12, TR13, and TR14, and the second port terminals TR21, TR22, TR23, and TR24. The resonance circuit 6 comprises Z31 (a capacitor) connected between terminals TR11 and TR21, Z32 (a capacitor) connected between terminals TR12 and TR22, Z33 (a capacitor) connected between terminals TR13 and TR23, Z34 (a capacitor) connected between terminals TR14 and TR24, Z41 (a resistor) connected between terminals TR21 and TR12, Z42 (a resistor) connected between terminals TR22 and TR13, Z43 (a resistor) connected between terminals TR23 and TR14, and Z44 (a resistor) connected between terminals TR24 and TR11.

The resonance circuit 6 has the signal having its phase shifted by $\phi_1$ with respect to the input signal inputted thereto via terminal TR11, has the signal having its phase shifted by $\phi_1+90°$ with respect to the input signal inputted thereto via terminal TR12, has the signal having its phase shifted by $\phi_1+180°$ with respect to the input signal inputted thereto via terminal TR13, has the signal having its phase shifted by $\phi_1+270°$ with respect to the input signal inputted thereto via terminal TR14, has the signal having its phase shifted by $\phi_2$ with respect to the input signal inputted thereto via terminal TR21, has the signal having its phase shifted by $\phi_2+90°$ with respect to the input signal inputted thereto via terminal TR22, has the signal having its phase shifted by $\phi_2+180°$ with respect to the input signal inputted thereto via terminal TR23, and has the signal having its phase shifted by $\phi_2+270°$ with respect to the input signal inputted thereto via terminal TR24. The resonance circuit 6 generates a quasi-resonant peak voltage under non-zero reactance in response to these phase-shifted signals supplied via the first and second ports.

Next, the effect of the composite resonance circuit 1 according to Embodiment 2 will be described using simulation results shown in FIG. 4. The simulation shown in FIG. 4 was executed with the capacitance value of Z31 (a capacitor) being set at 15.91549431 (pF), the capacitance value of Z32 (a capacitor) at 15.91549431 (pF), the capacitance value of Z33 (a capacitor) at 15.91549431 (pF), the capacitance value of Z34 (a capacitor) at 15.91549431 (pF), the resistance value of Z41 (a resistor) at 1,000 (Ω), the resistance value of Z42 (a resistor) at 1,000 (Ω), the resistance value of Z43 (a resistor) at 1,000 (Ω), and the resistance value of Z44 (a resistor) at 1,000 (Ω), and also with the internal resistance R1 of the first phase control circuit 4 connected to the resonance circuit 6 on the first port side being set at 707.1 (Ω) and the internal resistance R2 of the second phase control circuit 5 on the second port side at 707.1 (Ω).

Figure 4:
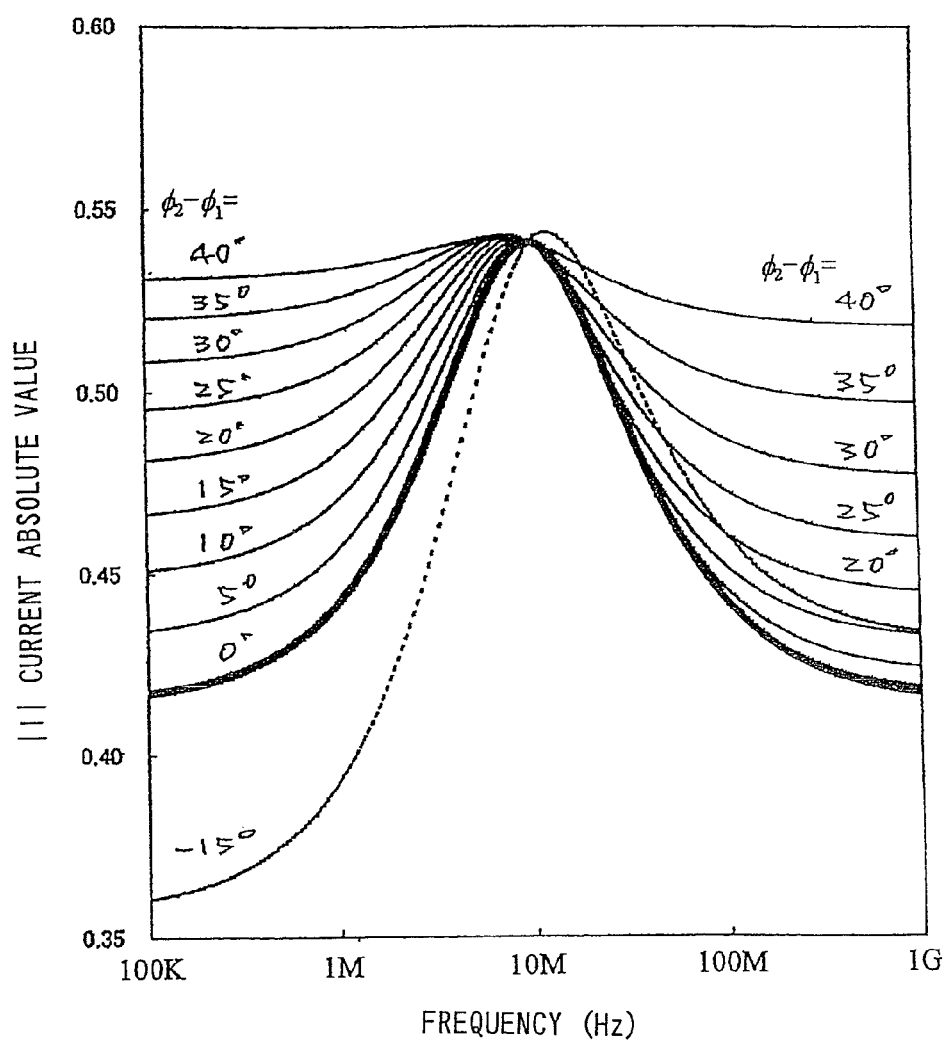
FIG. 4 is a graph of simulation results of the composite resonance circuit shown in FIG. 3.

FIG. 4 shows numerical simulation results of the composite resonance circuit shown in FIG. 3. The horizontal axis represents the frequency (Hz) of the input signal with a range of 100 KHz to 1 GHz, and its scale is a logarithmic scale. The vertical axis represents the absolute value |I| of the current flowing into the first port terminal TR11 of the resonance circuit 6. The absolute value of the current flowing into the terminal TR11 takes on a maximum value.

As shown in FIG. 4, when ($\phi_2-\phi_1$) is 0°, |I| has a peak symmetrical with respect to around 10 MHz. It is seen that as ($\phi_2-\phi_1$) increases, the peak value of |I| increases and shifts to the lower frequency side. Also, it is seen that as ($\phi_2-\phi_1$) increases, the half-with of the peak of |I| increases and the height of the peak increases. From this, it is seen that even with the resonance circuit 6 included in the composite resonance circuit 1 not having a resonance element or the like, a quasi-resonant peak current can be generated, and that by changing ($\phi_{2-1}$), the quasi-resonant peak current can be varied over a wide frequency range.

Embodiment 3

Figure 5:
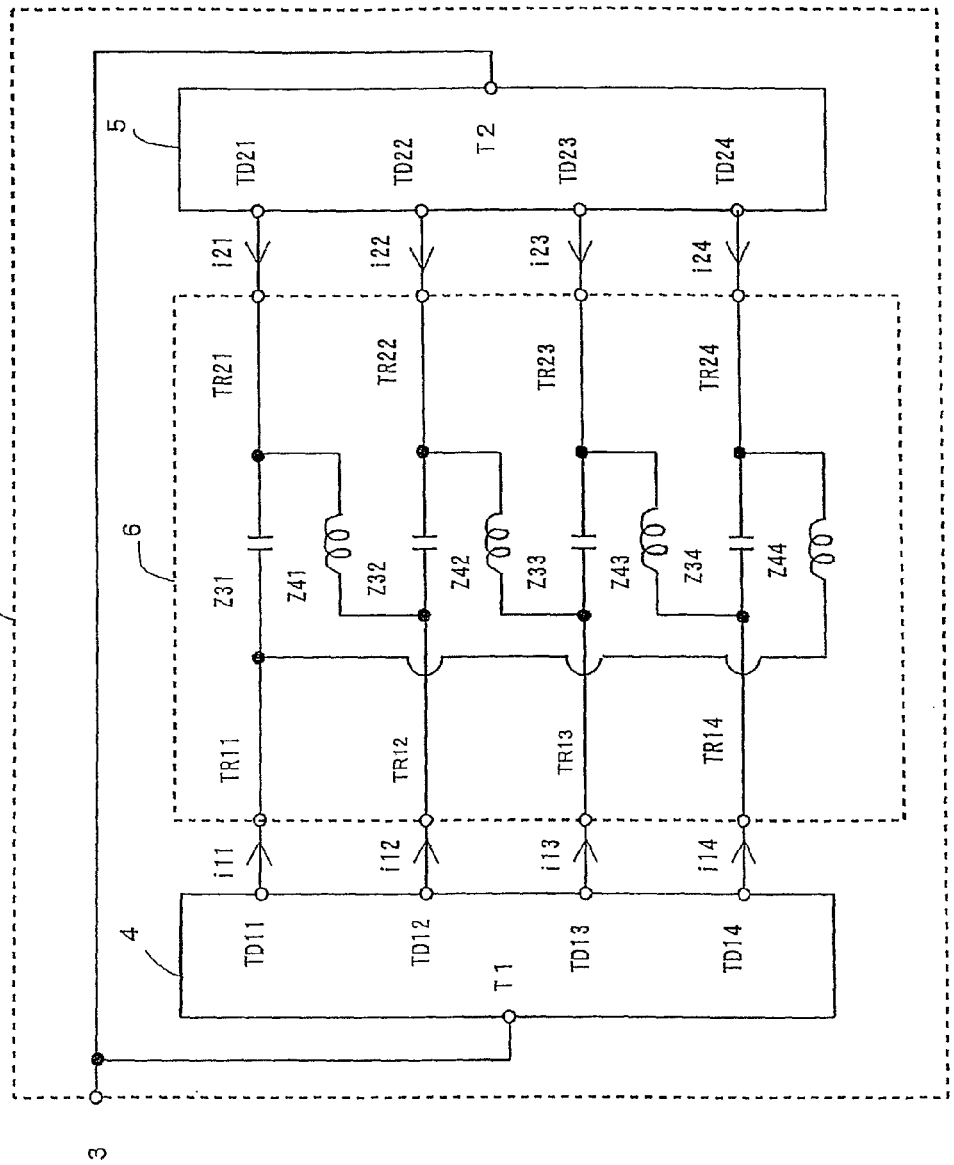
FIG. 5 is a circuit diagram of a composite resonance circuit of a third embodiment of the present invention.

The components of the composite resonance circuit 1 shown in FIG. 5 will be described in detail. The input terminal 3 of the composite resonance circuit 1 of FIG. 5 is connected to a standard signal generator SG (not shown) as in FIG. 1, and an input signal having its output power maintained constant and its frequency f swept continuously is applied to the input terminal 3 of the composite resonance circuit 1. The input signal is supplied to each of an input terminal T1 of the first phase control circuit 4 and an input terminal T2 of the second phase control circuit 5.

The function and the like of the first phase control circuit 4 and the second phase control circuit 5 according to Embodiment 3 shown in FIG. 5 are the same as those according to the embodiment shown in FIG. 3, and also the phase relationships between phase-shifted signals supplied to the first and second ports of the resonance circuit 6 shown in FIG. 5 are the same. Hence, detailed description thereof is omitted.

Next, the resonance circuit 6 shown in FIG. 5 will be described. The resonance circuit 6 has the first port terminals TR11, TR12, TR13, and TR14, and the second port terminals TR21, TR22, TR23, and TR24. The resonance circuit 6 comprises Z31 (a capacitor) connected between terminals TR11 and TR21, Z32 (a capacitor) connected between terminals TR12 and TR22, Z33 (a capacitor) connected between terminals TR13 and TR23, Z34 (a capacitor) connected between terminals TR14 and TR24, Z41 (a coil) connected between terminals TR21 and TR12, Z42 (a coil) connected between terminals TR22 and TR13, Z43 (a coil) connected between terminals TR23 and TR14, and Z44 (a coil) connected between terminals TR24 and TR11.

The resonance circuit 6 has the signal having its phase shifted by $\phi_1$ with respect to the input signal inputted thereto via terminal TR11, has the signal having its phase shifted by $\phi_1+90°$ with respect to the input signal inputted thereto via terminal TR12, has the signal having its phase shifted by $\phi_1+180°$ with respect to the input signal inputted thereto via terminal TR13, has the signal having its phase shifted by $\phi_1+270°$ with respect to the input signal inputted thereto via terminal TR14, has the signal having its phase shifted by $\phi_2$ with respect to the input signal inputted thereto via terminal TR21, has the signal having its phase shifted by $\phi_2+90°$ with respect to the input signal inputted thereto via terminal TR22, has the signal having its phase shifted by $\phi_2+180°$ with respect to the input signal inputted thereto via terminal TR23, and has the signal having its phase shifted by $\phi_2+270°$ with respect to the input signal inputted thereto via terminal TR24. The resonance circuit 6 generates a quasi-resonant peak voltage under non-zero reactance in response to these shifted signals supplied via the first and second ports.

Next, the effect of the composite resonance circuit 1 according to Embodiment 3 will be described using simulation results shown in FIG. 6. The simulation shown in FIG. 6 was executed with the capacitance value of Z31 (a capacitor) being set at 15.91549431 (pF), the capacitance value of Z32 (a capacitor) at 15.91549431 (pF), the capacitance value of Z33 (a capacitor) at 15.91549431 (pF), the capacitance value of Z34 (a capacitor) at 15.91549431 (pF), the inductance value of Z41 (a coil) at 15.91549431 (μH), the inductance value of Z42 (a coil) at 15.91549431 (μH), the inductance value of Z43 (a coil) at 15.91549431 (μH), and the inductance value of Z44 (a coil) at 15.91549431 (μH), and also with the internal resistance R1 of the first phase control circuit 4 connected to the resonance circuit 6 on the first port side being set at 1,000 (Ω) and the internal resistance R2 of the second phase control circuit 5 on the second port side at 1,000 (Ω).

Figure 6:
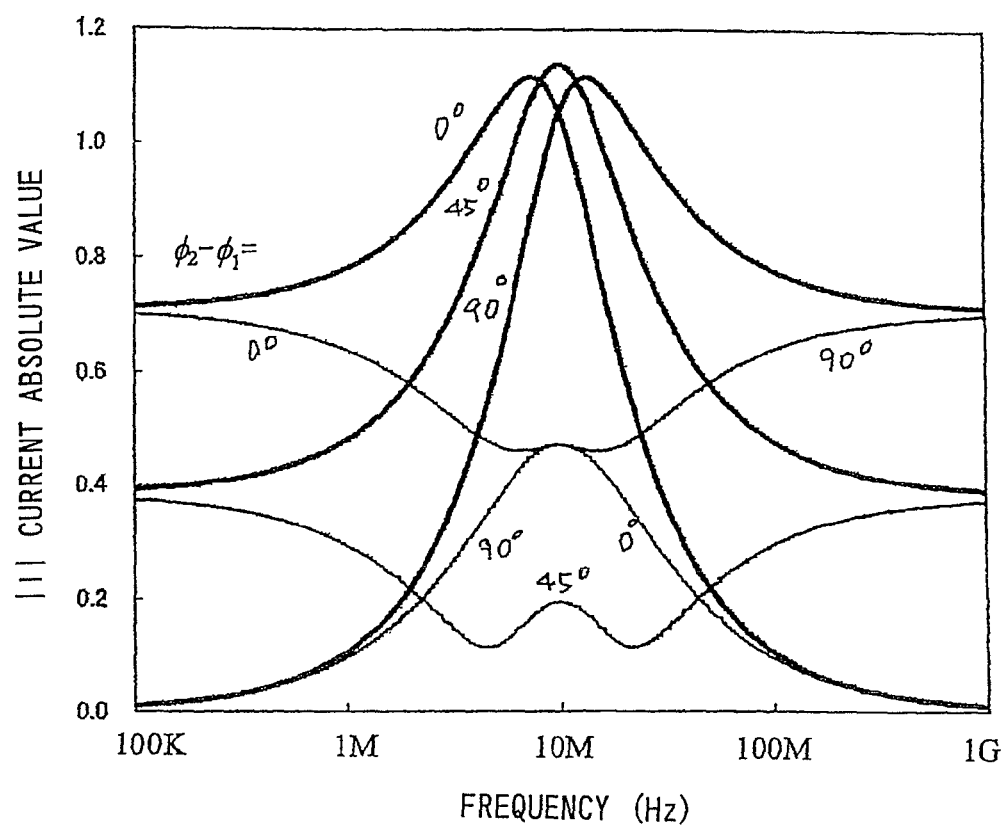
FIG. 6 is a graph of simulation results of the composite resonance circuit shown in FIG. 5.

FIG. 6 shows numerical simulation results of the composite resonance circuit shown in FIG. 5. The horizontal axis represents the frequency (Hz) of the input signal with a range of 100 KHz to 1 GHz, and its scale is a logarithmic scale. The vertical axis represents the absolute values |I| of the currents flowing into the first port terminal TR11 and the second port terminal TR21 of the resonance circuit 6. The thick lines in FIG. 6 indicate the absolute value |I| of the current flowing into the first port terminal TR11. The absolute value of the current flowing into the first port terminal TR11 takes on a maximum value.

As shown in FIG. 6, when ($\phi_2-\phi_1$) is 0', |I| has a peak symmetrical with respect to around 10 MHz. It is seen that as ($\phi_2-\phi_1$) increases, the peak value of |I| shifts to the higher frequency side. From this, it is seen that even with the resonance circuit 6 included in the composite resonance circuit 1 not having a resonance element or the like, a quasi-resonant peak current can be generated, and that by changing ($\phi_2-\phi_1$), the quasi-resonant peak current can be varied over a wide frequency range.

Figure 7:
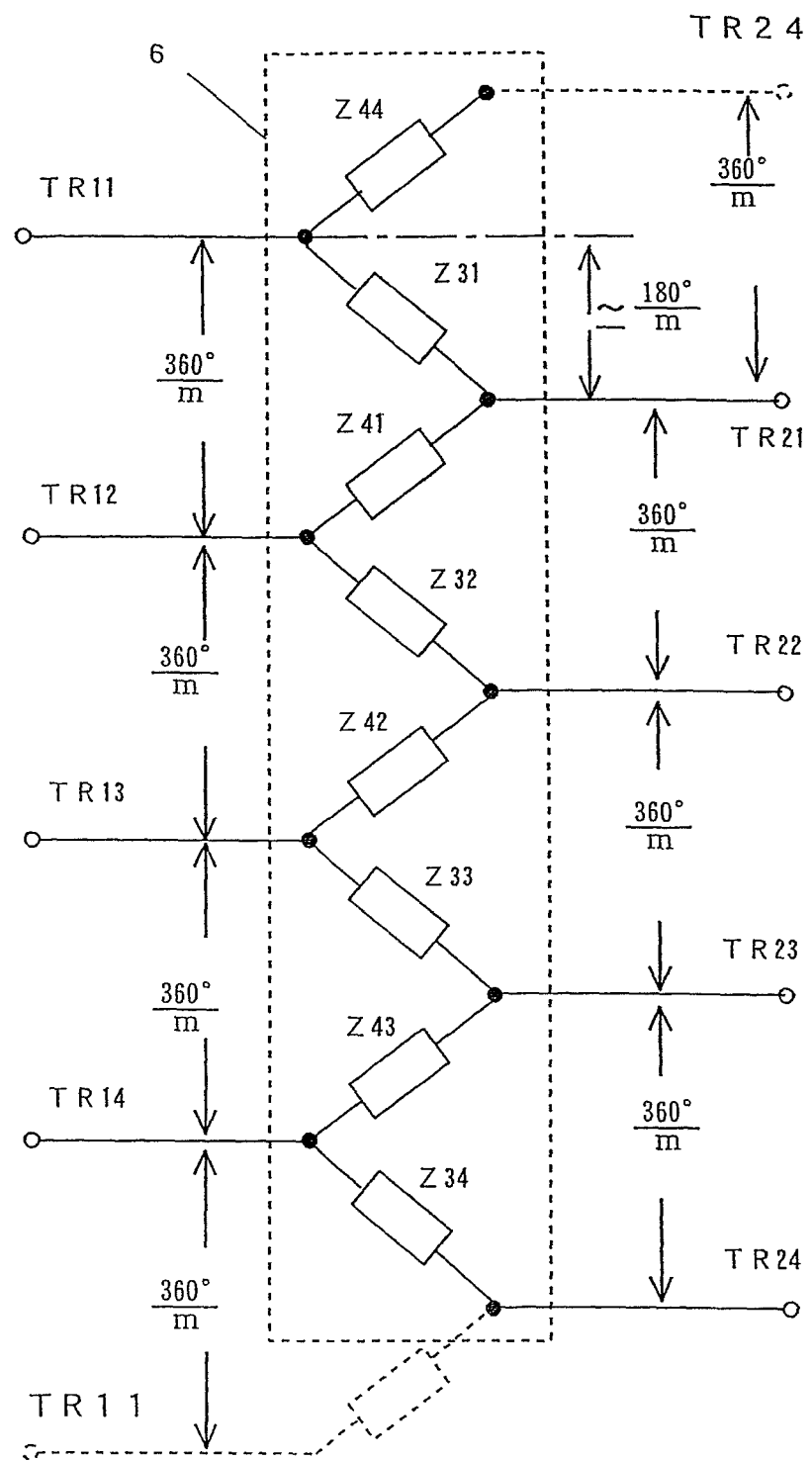
FIG. 7 is a circuit diagram of an annular multiphase input circuit according to Embodiments 1 to 3 of the present invention.

The resonance circuits in the composite resonance circuits according to Embodiments 1 to 3 being an annular multiphase input circuit will be described using FIG. 7. The circuit diagram shown in FIG. 7 is an expanded diagram of the resonance circuit 6 according to Embodiment 2 shown in FIG. 3 and the resonance circuit 6 according to Embodiment 3 shown in FIG. 5. Focusing attention on the resonance circuit 6, non-resonant two-terminal circuits Z3n and Z4n, where n=1 to 4, are connected annularly in the order of Z31->Z41->Z32->Z42->Z33->Z43->Z34->Z44->Z31, and hence the resonance circuit 6 is an annular impedance circuit.

The resonance circuit 6 is an annular multiphase input circuit. Here, the annular multiphase input circuit is a loop circuit consisting of a plurality of impedance elements connected annularly, and having a plurality of input ports that are pairs of input terminals between which at least one of the plurality of impedance elements is sandwiched, can receive a multiphase input.

Signals supplied to the four terminals TR11, TR12, TR13, TR14 of the first port will be described. The phase differences between TR11 and TR12, between TR12 and TR13, between TR13 and TR14, and between TR14 and TR11 are all 360°/m, where m is the number of phases, in the case of FIG. 7, m=4. Thus, the phase differences between adjacent ones of the four terminals of the first port are 90°. The phase differences between adjacent ones of the four terminals of the second port are also all 90°.

Here, the non-resonant two-terminal circuits Z3n and Z4n, where n=1 to 4, are classified according to the phase difference of signals between the first and second ports.

The phase of the signal supplied to the first port terminal TR11 is $\phi_1$ with respect to the input signal, and the phase of the signal supplied to the second port terminal TR21 is $\phi_2$. The phase difference between the two is ($\phi_1-\phi_2$). Likewise, the phase differences between the signals supplied to TR12 and TR22, TR13 and TR23, and TR14 and TR24 are ($\phi_1-\phi_2$). The two-terminal circuits Z31, Z32, Z33, Z34 connected between TR11 and TR21, TR12 and TR22, TR13 and TR23, and TR14 and TR24, where the phase difference between the first-port terminal and the second-port terminal is ($\phi_1-\phi_2$), are called a non-resonant intra-phase two-terminal circuit.

Meanwhile, the phase difference between TR11 and TR24 is $\phi_1-\phi_2+90°$; the phase difference between TR12 and TR21 is $\phi_1-\phi_2$ 90°; the phase difference between TR13 and TR22 is $\phi_1-\phi_2$ 90°; the phase difference between TR14 and TR23 is $\phi_1-\phi_2$ 90°; and the phase difference between TR11 and TR24 is $\phi_1-\phi_2$ 90°. The two-terminal circuits Z31, Z32, Z33, Z34 connected between TR12 and TR21, TR13 and TR22, TR14 and TR23, and TR11 and TR24, where the phase difference between the first-port terminal and the second-port terminal is ($\phi_1-\phi_2+90°$), are called a non-resonant inter-phase two-terminal circuit.

For this phase difference ($\phi_1-\phi_2$), the phase difference ($\phi_2-\phi_1$) with respect to phase $\phi_1$ at the first port is a control phase quantity as already mentioned.

As shown in FIG. 7, the non-resonant intra-phase two-terminal circuits Z3n (n=4) and the non-resonant inter-phase two-terminal circuits Z4n (n=4) are alternately connected in a ring to form an annular multiphase-type circuit structure. The elements of the non-resonant inter-phase two-terminal circuits and the non-resonant intra-phase two-terminal circuits are elements having no resonance frequency in a desired frequency range, i.e. a frequency range of target of this invention, such as resistors, capacitors, or coils.

Variants of the resonance circuits 6 (hereinafter also called an annular multiphase input circuit) described using FIGS. 1, 3, 5, and 7 will be described. Although as shown in FIG. 7, the inter-phase two-terminal circuit Z4n (n=4) is connected to intra-phase two-terminal circuits Z3n (n=4) adjacent to itself, the invention is not limited to this. For example, the inter-phase two-terminal circuit Z4n (n=4) may be connected to an adjacent-but-one intra-phase two-terminal circuit Z3n (n=4) beyond the intra-phase two-terminal circuit Z3n (n=4) adjacent to itself. In this case, Z41 of FIG. 7 is connected between TR13 and TR21, and Z43 is connected between TR11 and TR23. In this circuit configuration, an annular multiphase input circuit is formed which comprises an annular loop of Z31->Z41->Z33->Z43->Z31 (also called a first annular loop) with the inter-phase two-terminal circuits Z41 and Z43 respectively connected to the adjacent-but-one intra-phase two-terminal circuits Z33 and Z31. In addition to having the first annular loop, an annular multiphase input circuit may be formed by connecting the others in a ring to form a second annular loop of Z32->Z42->Z34->Z44->Z32. A composite resonance circuit having the first and second annular loops of adjacent-but-one connection has improved external noise resistance because of having two annular loops as compared with that having a loop of adjacent connection.

Yet another variant will be described. Although a single annular multiphase input circuit 6 is connected between the first and second ports as shown in FIG. 7, the invention is not limited to this. For example, the composite resonance circuit can take on a circuit configuration where a plurality of annular multiphase input circuits are connected in series and/or in parallel between the first and second ports. That is, a plurality of annular multiphase input circuits 6m (m=positive integers) may be connected in series between the first and second ports, or a plurality of annular multiphase input circuits 6n (n=positive integers) may be connected in parallel between the first and second ports. Further, at least one annular multiphase input circuits 6n (n=a positive integer) may be connected in parallel with at least one of a plurality of annular multiphase input circuits 6m (m=positive integers) connected in series between the first and second ports. These variants have the defect that the number of elements is increased, but have the advantage that the resonance frequency range, the quasi-resonant peak current value, and the like can be adjusted more precisely.

Embodiment 4

Figure 8:
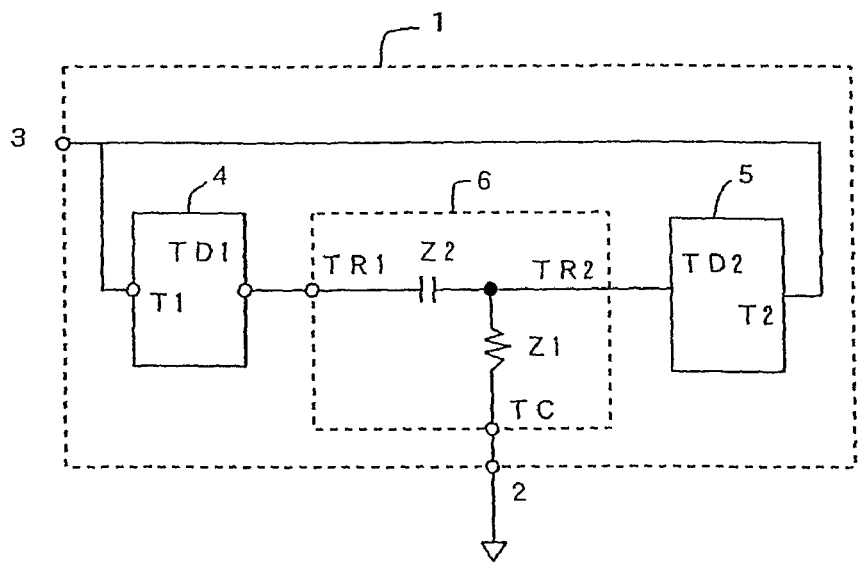
FIG. 8 is a circuit diagram of a composite resonance circuit of a fourth embodiment of the present invention.

Next, an embodiment of a composite resonance circuit having a radial multiphase resonance unit will be described using FIGS. 8 and 9. The input terminal 3 is connected to a standard signal generator SG (not shown) as in FIG. 1, which generates an input signal having its output power maintained constant and its frequency f swept continuously. The function and the like of the first phase control circuit 4 and the second phase control circuit 5 are the same as those of the embodiment shown in FIG. 1, and hence detailed description thereof is omitted. In the composite resonance circuit shown in FIG.

8, the first and second phase control circuits 4, 5 shift the phase of the input signal by $\phi_1$ and $\phi_2$ respectively and supply the phase-shifted signals to the resonance circuit 6.

Next, the resonance circuit 6 shown in FIG. 8 will be described. The resonance circuit 6 has a first port terminal TR1, a second port terminal TR2, and a terminal TC. The resonance circuit 6 comprises Z2 (a capacitor) connected between terminals TR1 and TR2, and Z1 (a resistor) connected between terminals TR2 and TC. The terminal TC is connected to a reference terminal 2.

The resonance circuit 6 has the signal having its phase shifted by $\phi_1$ with respect to the input signal inputted thereto via terminal TR1, and has the signal having its phase shifted by $\phi_2$ with respect to the input signal inputted thereto via terminal TR2. The resonance circuit 6 generates a quasi-resonant peak voltage under non-zero reactance in response to these shifted signals supplied via the first and second ports.

Next, the effect of the composite resonance circuit 1 according to Embodiment 4 will be described using simulation results shown in FIG. 9. The simulation shown in FIG. 9 was executed with the resistance value of Z1 (a resistor) being set at 1,000 ($\Omega$) and the capacitance value of Z2 (a capacitor) at 15.91549431 (pF), and also with the internal resistance R1 of the first phase control circuit 4 connected to the resonance circuit 6 on the first port side being set at 1,000 ($\Omega$) and the internal resistance R2 of the second phase control circuit 5 on the second port side at 1,000 ($\Omega$).

Figure 9:
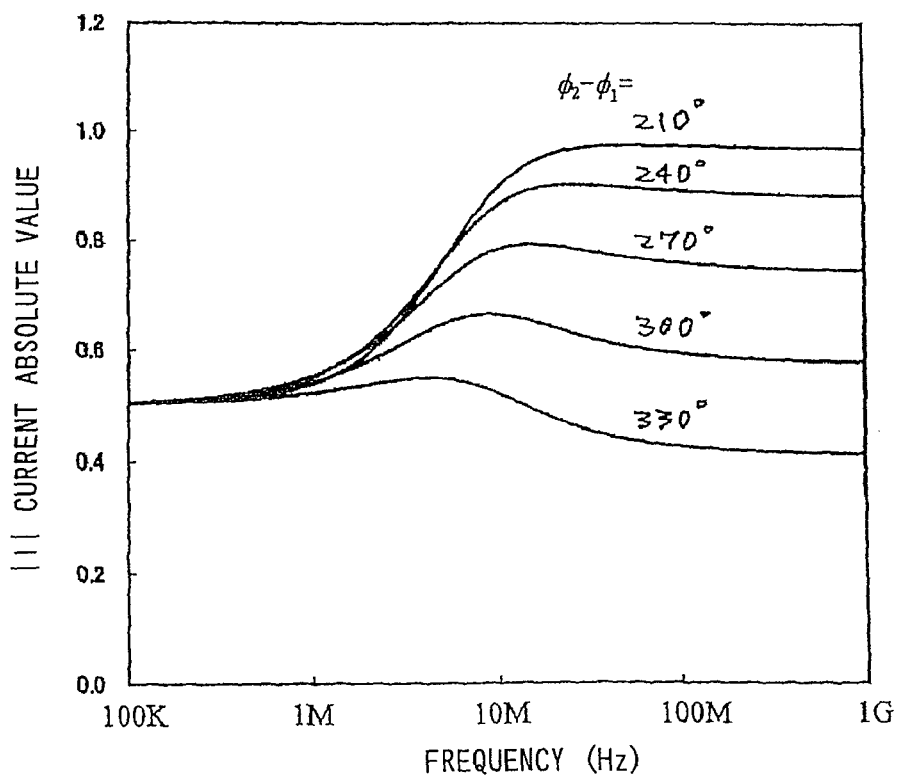
FIG. 9 is a graph of simulation results of the composite resonance circuit shown in FIG. 8.

The vertical axis and horizontal axis in FIG. 9 represent the same as in FIG. 2 and the like. As shown in FIG. 9, the peak of the absolute value |I| of the current flowing into the second port terminal TR2 shifts depending on the control phase quantity ($\phi_2-\phi_1$) with its maximum value greatly changing. From this, it is seen that even with the resonance circuit 6 included in the composite resonance circuit 1 not having a resonance element or the like, a quasi-resonant peak current can be generated, and that by changing ($\phi_2-\phi_1$) the quasi-resonant peak current can be varied over a wide frequency range. Further, it is seen that for all values of ($\phi_2-\phi_1$), |I| is greater than with the annular multiphase input circuits shown in Embodiments 1 to 3. This indicates that there is an advantage in terms of the noise resistance over the annular multiphase input circuits shown in Embodiments 1 to 3.

A variant of the radial multiphase input circuit will be described. Although description has been made of the composite resonance circuit shown in FIG. 8 having a single radial multiphase input circuit, the resonance circuit may comprise a plurality of radial multiphase input circuits. That is, a plurality of radial multiphase input circuits may be connected in series and/or in parallel between the first and second ports. With this configuration, the number of non-resonant elements is increased, but there is the advantage that the resonance frequency range, the quasi-resonant peak current value, and the like can be adjusted more precisely.

Embodiment 5

Next, a composite resonance circuit 1 comprising a resonance unit having an annular multiphase input circuit and a radial multiphase input circuit will be described using FIGS. 10 and 11.

Figure 10:
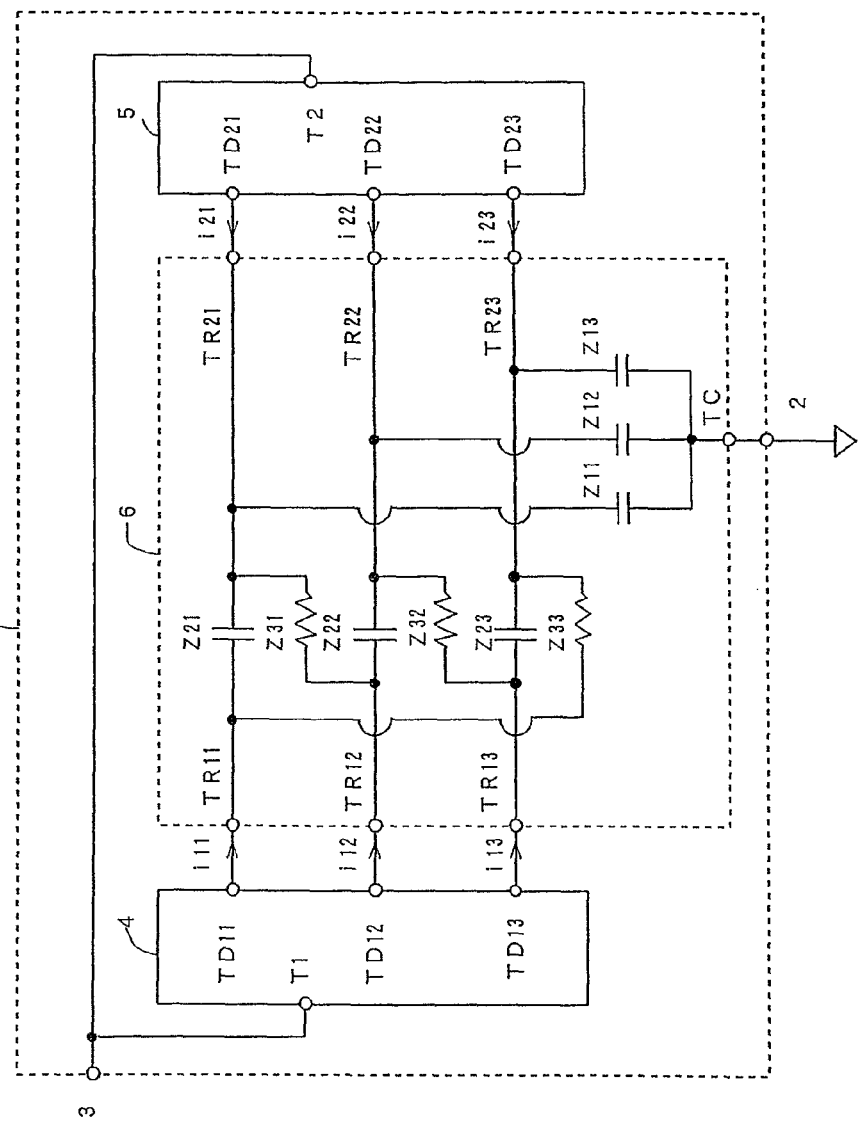
FIG. 10 is a circuit diagram of a composite resonance circuit of a fifth embodiment of the present invention.

The input terminal 3 of the composite resonance circuit 1 shown in FIG. 10 is connected to a standard signal generator SG as in FIG. 1, which generates an input signal having its output power maintained constant and its frequency f swept continuously. The function and the like of the first phase control circuit 4 and the second phase control circuit 5 are the same as those of Embodiment 1 shown in FIG. 1, and hence detailed description thereof is omitted. In the composite resonance circuit 1 shown in FIG. 10, the first phase control circuit 4 shifts the phase of the input signal by $\phi_1$, $\phi_1+120°$, and $\phi_1+240°$ and outputs the phase-shifted signals to first port terminals TR11, TR12, TR13 of the resonance circuit 6. Likewise, the second phase control circuit 5 shifts the phase of the input signal by $\phi_2$, $\phi_2+120°$, and $\phi_2+240°$ and outputs the phase-shifted signals to second port terminals TR21, TR22, TR23 of the resonance circuit 6.

Next, the resonance circuit 6 shown in FIG. 10 will be described. The resonance circuit 6 has the first port terminals TR11, TR12, TR13, the second port terminals TR21, TR22, TR23, and a common terminal TC. The resonance circuit 6 comprises Z21 (a capacitor) connected between terminals TR11 and TR21, Z22 (a capacitor) connected between terminals TR12 and TR22, Z23 (a capacitor) connected between terminals TR13 and TR23, Z31 (a resistor) connected between terminals TR21 and TR12, Z32 (a resistor) connected between terminals TR22 and TR13, and Z33 (a resistor) connected between terminals TR23 and TR11. It is seen that these capacitors and resistors form an annular circuit of Z21->Z31->Z22->Z32->Z23->Z33->Z21, and that an annular multiphase input circuit as shown in FIG. 7 is embodied by this annular configuration.

The resonance circuit 6 further comprises Z11 (a capacitor) connected between terminal TR21 and common terminal TC, Z12 (a capacitor) connected between terminal TR22 and common terminal TC, and Z13 (a capacitor) connected between terminal TR23 and common terminal TC. These capacitors Z11, Z12, Z13 are connected at their one terminal to the common terminal TC, and the other terminals are respectively connected to the second port terminals TR21, TR22, TR23 that receive different phase-shifted signals.

The resonance circuit 6 comprises the annular multiphase input circuit and a radial multiphase input circuit. This radial multiphase input circuit is a circuit in which one terminal of each of a plurality of impedance elements is connected to a common terminal with the other terminals being respectively connected to a plurality of input terminal pairs and which can receive a multiphase input. The annular multiphase input circuit and radial multiphase input circuit of the resonance circuit 6 shown in FIG. 10 are connected to input port terminal pairs of TR11 and TR21, TR12 and TR22, and TR13 and TR23 common to them. The connection of the common terminal TC and a reference terminal 2 is not necessarily needed.

It will be described using FIG. 11 that the resonance circuit 6 generates a quasi-resonant peak current under non-zero reactance in response to these shifted signals supplied via the first and second ports.

Figure 11:
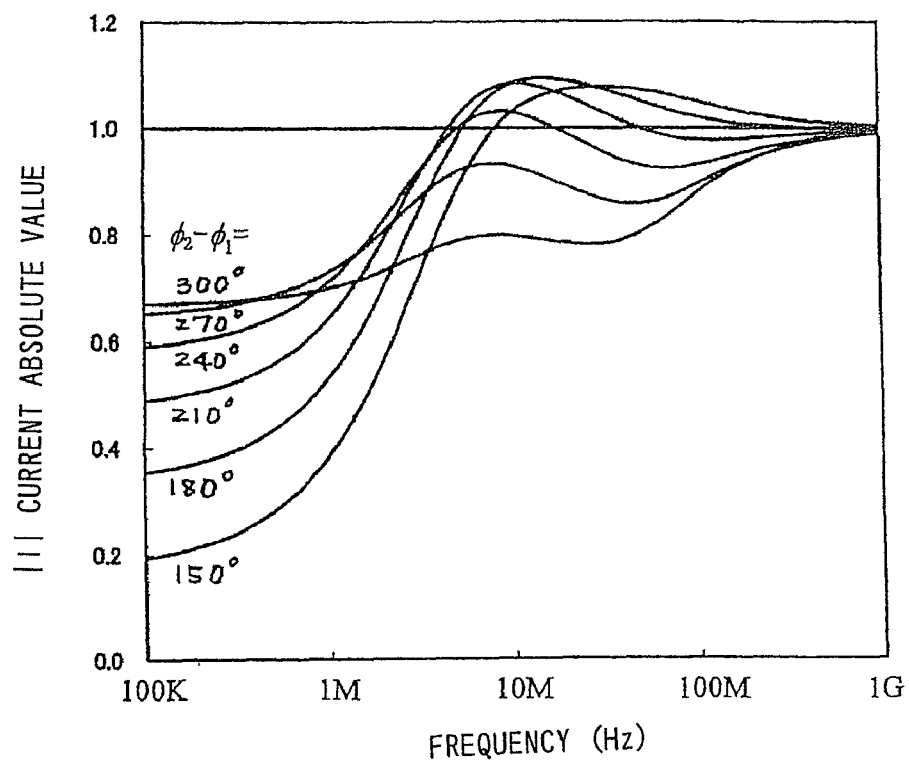
FIG. 11 is a graph of simulation results of the composite resonance circuit shown in FIG. 10.

The simulation, whose results are shown in FIG. 11, was executed with the capacitance value of Z11 (a capacitor) of the radial multiphase input circuit being set at 15.91549431 (pF), the capacitance value of Z12 (a capacitor) at 15.91549431 (pF), and the capacitance value of Z13 (a capacitor) at 15.91549431 (pF), and also with the capacitance value of Z21 (a capacitor) of the annular multiphase input circuit being set at 15.91549431 (pF), the capacitance value of Z22 (a capacitor) at 15.91549431 (pF), the capacitance value of Z23 (a capacitor) at 15.91549431 (pF), the resistance value of Z31 (a resistor) at 1,000 ($\Omega$), the resistance value of Z32 (a resistor) at 1,000 ($\Omega$), and the resistance value of Z33 (a resistor) at 1,000 ($\Omega$), and also with the three internal resistances of the first phase control circuit 4 connected to the resonance circuit 6 on the first port side, that is, the resistances of the peripheral circuit as viewed from the terminals TD11, TD12, TD13 being set at 1,000 ($\Omega$) and the three internal resistances of the second phase control circuit 5 on the second port side, that is, the resistances of the peripheral circuit as viewed from the terminals TD21, TD22, TD23 at 1,000 ($\Omega$).

The vertical axis and horizontal axis in FIG. 11 represent the same as in FIG. 2 and the like. As shown in FIG. 11, the peak of the absolute value |I| of the current flowing into the second port terminal TR21 shifts depending on the control phase quantity ($\phi_2-\phi_1$) with its maximum value greatly changing. From this, it is seen that even with the resonance circuit 6 included in the composite resonance circuit 1 not having a resonance element or the like, a quasi-resonant peak current can be generated, and that by changing ($\phi_2-\phi_1$), the quasi-resonant peak current can be varied over a wide frequency range. Further, it is seen that for all values of ($\phi_2-\phi_2$), |I| is generally greater than with the annular multiphase input circuits shown in Embodiments 1 to 3. This indicates that there is an advantage in terms of the noise resistance over the resonance circuits having only the annular multiphase input circuit shown in Embodiments 1 to 3.

Although description has been made in which the composite resonance circuit shown in FIG. 10 comprises one annular multiphase input circuit and one radial multiphase input circuit, not being limited to this, the resonance circuit may comprise at least one annular multiphase input circuit and at least one radial multiphase input circuit. For example, one radial multiphase input circuit may be cascade-connected between two cascade-connected, annular multiphase input circuits, or conversely one annular multiphase input circuit may be cascade-connected between two cascade-connected, radial multiphase input circuits. With this configuration, the number of non-resonant elements is increased, but there is the advantage that the resonance frequency range, the quasi-resonant peak current value, and the like can be adjusted more precisely.

With the composite resonance circuit according to the present invention, a quasi-resonant peak current can be generated using a non-resonant element without a resonance circuit such as a serial LC circuit. Hence, the number of elements is reduced, thus further reducing manufacturing costs. In addition, the maximum value of the quasi-resonant peak current is variable over a wide frequency range. Thus, the quasi-resonance frequency can be varied over a wide frequency range without changing the element constant of the non-resonant element.

The invention claimed is:

1. A composite resonance circuit comprising:
   an input terminal;
   a resonance unit having first and second ports and resonating in response to alternating-current signals respectively supplied to said first and second ports;
   a first phase shift circuit having an input end connected to said input terminal and an output end connected to said first port, that performs a first phase shift on an alternating-current signal supplied to said input terminal and supplies a first shifted signal subjected to the phase shift to said first port, and
   a second phase shift circuit having an input end connected to said input terminal and an output end connected to said second port, that performs a second phase shift different from said first phase shift on said input alternating-current signal supplied to said input terminal and supplies a second shifted signal subjected to the phase shift to said second port,
   wherein said resonance unit is an impedance circuit that has at least four input terminals forming said first and second ports and that has a resonance frequency varying in response to said first and second shifted signals coming in via said first and second ports, and a maximum current flows into said first port at said resonance frequency.

2. A composite resonance circuit according to claim 1, wherein said impedance circuit is a circularly connected multiphase input circuit.

3. A composite resonance circuit according to claim 1, wherein said impedance circuit is a radially connected multiphase input circuit.

4. A composite resonance circuit according to claim 1, wherein said impedance circuit comprises a circularly connected multiphase input circuit and a radially connected multiphase input circuit which have a common input port.

* * * * *